(12) United States Patent  
Freeman (10) Patent No.: US 6,562,641 B1  
(45) Date of Patent: May 13, 2003

(54) APPARATUS AND METHODS OF SEMICONDUCTOR PACKAGES HAVING CIRCUIT-BEARING INTERCONNECT COMPONENTS

(75) Inventor: Stacy L. Freeman, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/644,196

(22) Filed: Aug. 22, 2000

(51) Int. Cl.$^7$ .............................................. H01L 21/66
(52) U.S. Cl. ........................................ 438/18; 257/678
(58) Field of Search .............................. 438/10, 14, 15, 438/17, 18, 118–119, 123; 257/48, 678, 690, 692

(56) References Cited

U.S. PATENT DOCUMENTS

| | | | |
|---|---|---|---|
| 5,519,332 A | | 5/1996 | Wood et al. ................. 324/755 |
| 5,629,838 A | * | 5/1997 | Knight et al. ................ 361/782 |
| 5,663,106 A | | 9/1997 | Karavakis et al. ............ 29/841 |
| 5,734,560 A | * | 3/1998 | Kamperman et al. ....... 361/774 |
| 5,777,379 A | | 7/1998 | Karavakis et al. .......... 257/668 |
| 5,821,608 A | | 10/1998 | DiStefano et al. .......... 257/669 |
| 5,861,666 A | * | 1/1999 | Bellaar ........................ 257/686 |
| 5,895,970 A | * | 4/1999 | Miyoshi ..................... 257/696 |
| 5,971,253 A | * | 10/1999 | Gilleo et al. ........... 228/180.22 |
| 6,022,759 A | * | 2/2000 | Seki et al. .................. 438/123 |
| 6,048,753 A | | 4/2000 | Farnworth et al. .......... 438/111 |
| 6,165,817 A | * | 12/2000 | Akram et al. ............... 438/118 |
| 6,166,556 A | * | 12/2000 | Wang et al. ................. 324/765 |
| 6,169,329 B1 | | 1/2001 | Farnworth et al. .......... 257/780 |
| 6,239,485 B1 | * | 5/2001 | Peters et al. ................ 257/700 |
| 6,278,181 B1 | * | 8/2001 | Maley ........................ 257/712 |
| 6,291,272 B1 | * | 9/2001 | Giri et al. ................... 438/121 |
| 6,329,708 B1 | * | 12/2001 | Komiyama ................. 257/678 |
| 6,369,331 B1 | * | 4/2002 | Kusano et al. ............. 174/260 |

* cited by examiner

Primary Examiner—David Nelms  
Assistant Examiner—David Vu  
(74) Attorney, Agent, or Firm—Dorsey & Whitney, LLP (57) ABSTRACT

Apparatus and methods of testing and assembling fine ball grid array (FBGA) packages having circuit-bearing interconnect components. In one embodiment, a circuit-bearing interconnect component includes a substrate having a plurality of first conductive members disposed therethrough, a plurality of conductive traces coupled to the first conductive members and extending away from the first conductive members to a distal portion of the substrate, and a plurality of second conductive members disposed on the distal portion and coupled to the conductive traces. The substrate may be rigid or flexible. The first conducting members are located within an engagement area that is adapted to be engageable with a semiconductor component having a plurality of conductive bumps wherein each conductive bump engages one of the first conductive members. The first conductive members may include conductively-plated via or conductive pins. In an alternate embodiment, an apparatus further includes a semiconductor component having a plurality of conductive bumps disposed thereon. The circuit-bearing interconnect component may permit efficient, accurate, and reliable testing of the semiconductor component when the semiconductor component is attached to a semiconductor device, such as a printed circuit board.

16 Claims, 4 Drawing Sheets

APPARATUS AND METHODS OF SEMICONDUCTOR PACKAGES HAVING CIRCUIT-BEARING INTERCONNECT COMPONENTS

TECHNICAL FIELD

The present invention relates to apparatus and methods of testing and assembling semiconductor packages, and more specifically, to testing and assembling fine ball grid array (FBGA) packages having circuit-bearing interconnect components.

BACKGROUND OF THE INVENTION

As the trend toward decreasing the size of microelectronic packages continues, challenges associated with packaging and testing it semiconductor devices are continuously encountered. Fine ball grid array (FBGA) semiconductor packages, for example, offer reduced package volumes and desirable performance characteristics. Testing of FBGA semiconductor packages, however, may be difficult, and the difficulty may increase as the size of the FBGA package decreases.

Figure 1:
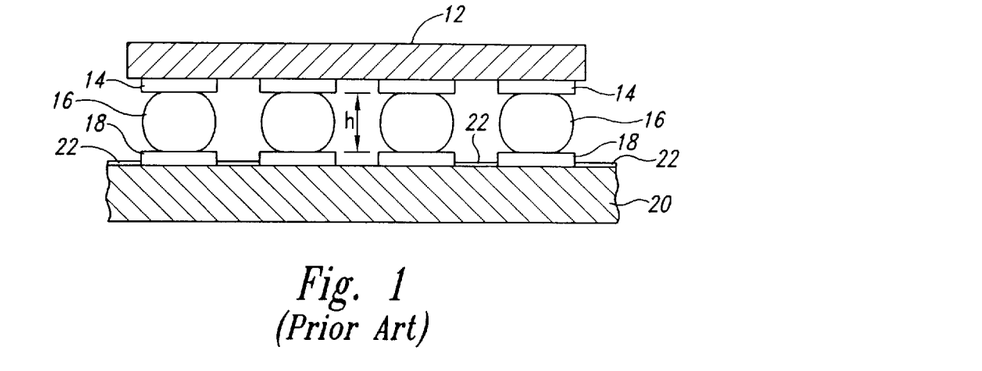
FIG. 1 is a side cross-sectional view of an FBGA package in accordance with the prior art.

FIG. 1 is a cross-sectional elevational view of a typical FBGA package 10. The FBGA package 10 includes a bumped die 12 having a plurality of bond pads 14 formed thereon. An electrically conductive ball or bump 16 (typically composed of solder or a gold alloy) is formed on each bond pad 14, and is attached to associated contact pad 18 formed on a substrate 20, such as a test carrier or a printed circuit board. A conductive trace 22 is formed on the surface of the substrate 20 and is attached to one of the contact pads 18. The conductive traces 22 typically fan out from the bumped die 12 and may be connected to other electronic components or to test equipment. FBGA packages of the type shown in FIG. 1 are more fully described, for example, in U.S. Pat. Nos. 5,663,106 and 5,777,379 to Karavakis et al, and in U.S. Pat. No. 5,821,608 to DiStefano et al, which patents are incorporated herein by reference.

As mentioned above, for testing of the FBGA package 10, the substrate 20 may be a test carrier that temporarily engages the conductive bumps 14 of the bumped die 12. Suitable test carriers for testing unpackaged die 12 are described, for example, in U.S. Pat. No. 5,519,332 to Wood et al, incorporated herein by reference. Generally, such carriers are suitable for use with automated equipment and assembling procedures utilized in high-volume semiconductor manufacturing. Design considerations of such test carriers include the carrier's ability to transmit and receive electrical signals over a wide temperature range, thermal management characteristics, power and signal distribution characteristics, cost and reusability.

Testing of the bumped die 12 generally includes four levels of testing. A first or "standard probe" level includes the standard tests for gross functionality of die circuitry. A second or "speed probe" level includes testing the speed performance of the die for the fastest speed grades. A third or "burn-in die" level involves thermal cycling tests intended to drive contaminants into the active circuitry and to detect early failures. And a fourth or "known good die (KGD)" level includes testing to provide a reliability suitable for final products.

To ensure proper transmission of the test signals and output signals, the conductive bumps 16 may be temporarily connected with the contact pads 18 of the substrate 20 by reflowing the bumps, thereby soldering the bumps to the contact pads. After the testing is complete, the conductive bumps 16 may be reflowed to disconnect the bumps from the contact pads 18. After testing, the bumped die 12 is usually placed in operation by attaching the bumped die 12 to a printed circuit board or another semiconductor component. Again, the conductive bumps 16 are placed in contact with the contact pads 18 of the printed circuit board, and are reflowed to bond the conductive bumps 16 to the contact pads 18, thereby attaching the bumped die 12 to the printed circuit board.

Connecting and disconnecting the conductive bumps 16 from the contact pads 18, however, involves time-consuming processes and may damage the conductive bumps 16 or the contact pads 18. Also, even though a bumped die 12 tests successfully using the test carrier, the final connection between the conductive bumps 16 of the bumped die 12 and the contact pads 18 of the printed circuit board may not always be good. Therefore, it is usually desirable to conduct additional testing of the bumped die 12 after it has been assembled with the printed circuit board in the final FBGA package 10.

Currently, conductive bumps 16 may range in height h (FIG. 1) from 0.75 mm down to 0.15 mm depending upon the die or semiconductor component. Typical "pitch" or spacing between adjacent conductive bumps 16 may range from 0.65 mm down to 0.13 mm (130 micron) or less. Furthermore, a semiconductor die or memory chip may have several hundred conductive bumps. Due to the extremely small sizes of the conductive bumps, the spacing between bumps, and the large number of bumps in typical FBGA packages, testing of such packages presents extreme challenges. For example, when the conductive bumps 16 of the bumped die 12 are attached to the contact pads 18 of the substrate 20, it is often not possible to measure a test signal at (or near) each of the conductive bumps 16 to determine the performance of a particular circuit or connection within the bumped die 12. This is especially true for those conductive bumps 16 which are not along the edges of the FBGA package 10. As the trend toward reducing the size of FBGA packages continues, the difficulties associated with testing such packages will continue to increase.

SUMMARY OF THE INVENTION

The present invention is directed to apparatus and methods of testing and assembling fine ball grid array (FBGA) packages having circuit-bearing interconnect components. In one aspect, a circuit-bearing interconnect component includes a substrate having a plurality of first conductive members disposed therethrough, a plurality of conductive traces coupled to the first conductive members and extending away from the first conductive members to a distal portion of the substrate, and a plurality of second conductive members disposed on the distal portion and coupled to the conductive traces. The substrate may be rigid or flexible. The first conducting members are located within an engagement area that is adapted to be engageable with a semiconductor component having a plurality of conductive bumps wherein each conductive bump engages one of the first conductive members. The first conductive members may include conductively-plated via or conductive pins. The circuit-bearing interconnect component may advantageously permit efficient, accurate, and reliable testing of the semiconductor component when the semiconductor component is attached to a semiconductor device, such as a printed circuit board.

In an alternate aspect, a semiconductor package includes a semiconductor component having a plurality of conductive bumps disposed thereon, a substrate including a plurality of first conductive members disposed within an engagement area, each first conductive member being attached to one of the conductive bumps and extending through a thickness of the substrate, the substrate further having at least one distal portion extending away from the engagement area, a plurality of conductive traces each having a first end electrically coupled with one of the first conductive members and a second end An extending away from the one first conductive member and onto the at least one distal portion, and a plurality of second conductive members disposed on the at least one distal portion, each second conductive member being coupled to one of the conductive traces.

DETAILED DESCRIPTION OF THE INVENTION

The present invention is generally directed to apparatus and methods of testing and assembling fine ball grid array (FBGA) packages having circuit-bearing interconnect components. Many specific details of certain embodiments of the invention are set forth in the following description and in FIGS. 2–7 to provide a thorough understanding of such embodiments. One skilled in the art will understand, however, that the present invention may have additional embodiments, or that the present invention may be practiced without several of the details described in the following description.

Unless otherwise stated, the construction and operation of various components of the embodiments described below may be of conventional design. Such components will be referred to using the same names and designation numbers as were used in the preceding background discussion. For the sake of brevity, such components will not be described in further detail herein, as these components are within the understanding of those skilled in the relevant art.

Figure 2:
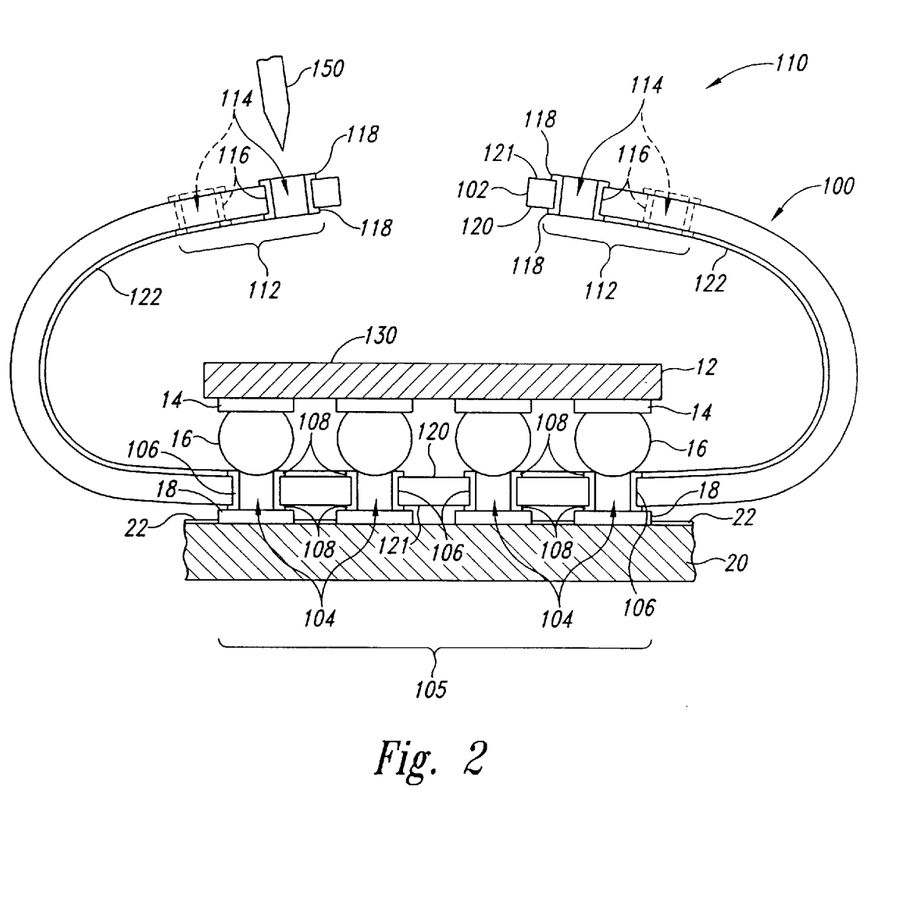
FIG. 2 is a side cross-sectional view of a semiconductor package having a bumped die engaged with a circuit-bearing interconnect component in accordance with an embodiment of the invention.

FIG. 2 is a side cross-sectional view of a semiconductor package 110 having a bumped die 12 engaged with a circuit-bearing interconnect component 100 in accordance with an embodiment of the invention. The circuit-bearing interconnect component 100 includes a substrate 102 having a first surface 120 and a second surface 121. As shown in the upper plan view of FIG. 3, the substrate 102 may be a flexible substrate 102 that is shapeable into a flattened position (described more fully below). A plurality of inner vias 104 are distributed throughout an inner area 105 of the substrate 102 and disposed therethrough. The inner vias 104 are positioned within the inner area 105 such that each inner via 104 is aligned with one of the conductive bumps 16 of the bumped die 12. A layer of conductive material 106 is formed within each of the inner via 104 and forms an inner contact ring 108 at each end of the respective inner via 104. As best shown in FIG. 2, the inner contact rings 108 may project slightly beyond, and may slightly overlap, the first and second surfaces 120, 121 of the substrate 102.

Figure 3:
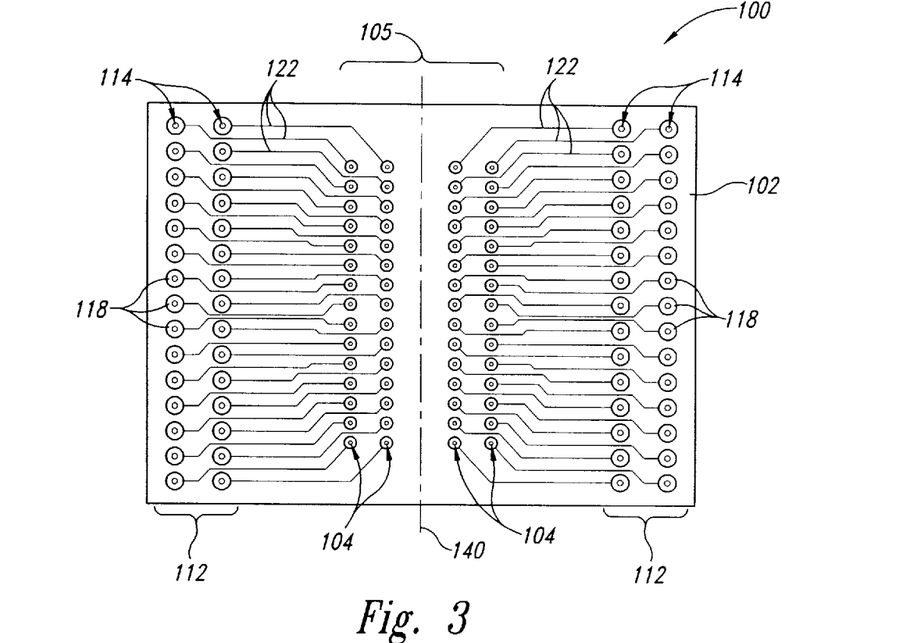
FIG. 3 is an upper plan view of an embodiment of a circuit-bearing interconnect component of FIG. 2 having a flexible substrate.

In the embodiment shown in FIGS. 2 and 3, the substrate 102 further includes a pair of outer areas 112 each having a plurality of outer vias 114 disposed therethrough. A conductive layer 116 is disposed within each of the outer vias 114, each conductive layer 116 forming an outer contact ring 118 at the end of the respective outer via 114. A plurality of conductive leads (or "traces") 122 are formed on the first surface 120 of the substrate 102. Each lead 122 has an inner end coupled to one of the inner contact rings 108, and an outer end coupled to one of the outer contact rings 118.

The substrate 102 may be composed of any suitable insulative material that prevents electrical shorts between the various conductive components (vias, leads, etc.). For example, the substrate 102 may be a rigid material (FIG. 2), such as a thermoplastic or fiberglass material. Alternately, the substrate 102 may be composed of a flexible material (FIGS. 2 and 3). Suitable flexible materials for the substrate 102 include, for example, a flexible dielectric elastomeric or polymeric material, such as a polyimide material. In other embodiments, the substrate 102 may have both rigid and flexible portions. Furthermore, although the conductive leads 122 are shown as being disposed on the first surface 120 of the substrate 102, the leads 122 could be disposed on the second surface 121, on both surfaces 120, 121, or could be embedded within the interior of the substrate 102.

The embodiment of the circuit-bearing interconnect component 100 shown in FIG. 3 is configured for an FBGA package having 60 conductive bumps (four rows of 15 bumps each) at a pitch of approximately 0.50 mm. Of course, a variety of alternate embodiments of circuit-bearing interconnect components may be designed to accommodate a wide variety of different bump configurations, patterns, spacing, and may accommodate semiconductor components having virtually any number of conductive bumps.

During assembly, the conductive bumps 16 of the bumped die 12 may be aligned with respective inner vias 104 of the circuit-bearing interconnect component 100. The conductive bumps 16 may then be attached to respective inner contact rings 108 on the first surface 120 of the substrate 104, such as by reflowing the conductive bumps 16, to form an electrical contact between the bumped die 12 and the circuit-bearing interconnect component 100. Similarly, the contact pads 18 of the printed circuit board 20 may be aligned with respective inner vias 104 and attached to respective inner contact rings 108 on the second surface 121 using a variety of known attachment techniques, including soldering, thermal bonding, or using a layer of conductive adhesive (not shown). Thus, each inner via 104 is electrically coupled between its associated conductive bump 16 and contact pad 18, and each outer via 114 is electrically coupled with its associated inner via 104.

It should be understood that although the circuit-bearing interconnect component 100 is shown in FIG. 2 as extending beyond opposing sides of the bumped die 12, in alternate embodiments, the component may be modified to extend outwardly from beneath the bumped die 12 in a single direction (i.e. out a single side), in two directions (FIG. 2), in three directions or in four or more directions. For example, the circuit-bearing interconnect component 100 could be split into two separate components along a dividing line 140 (FIG. 3), with each resulting circuit-bearing interconnect component extending beyond the edge of the bumped die 12 in only a single direction. Therefore, depending on the spacing of the bumped die 12 on the printed circuit board 20 in relation to other components or structures, a variety of circuit-bearing interconnect components may be conceived to meet the particular needs of the application.

The circuit-bearing interconnect component 100 advantageously allows the bumped die 12 to be tested easily and efficiently after it has been assembled with the substrate 20. Because the substrate 102 may be shaped to position the outer vias 114 proximate the back side surface of the bumped die 12, the outer vias 114 are easily accessible. As shown in FIG. 2, both the rigid and flexible substrate embodiments may be shaped to bend through an approximately 180 degree angle so that the outer vias 114 are positioned over a backside surface 130 of the bumped die 12. A test probe 150 may then be easily inserted into any desired outer via 114 for transmitting test signals to, or receiving signals from, one of the conductive leads 122 on the substrate 102 coupled to a desired conductive bump 16. In this way, using one or more test probes 150, the internal circuitry of the bumped die 12 may be selectively tested after the bumped die 12 has been coupled with the substrate 20. Alternately, electrical signals may be transmitted to the bumped die 12 using the substrate 20, and appropriate output signals from the bumped die 12 to the substrate 20 may be monitored at the conductive bumps 16 using the circuit-bearing interconnect component 100.

Another advantage afforded by the circuit-bearing interconnect component 100 is that the test signals measured using the test probe 150 inserted into the outer via 114 may be of higher quality than test signals monitored using conventional methods. Because the conductive traces 122 are relatively short, the signals measured at the outer via 114 may be stronger and less subject to interference effects. The circuit-bearing interconnect component 100 may thereby provide more accurate and reliable test results compared with conventional test methods.

In alternate embodiments, the size and spacing of the outer vias 114 may be adjusted so that as the outer areas 112 are positioned over the back side surface of the bumped die 12, the pattern of outer vias 114 matches a standard pattern, such as the pattern of inner vias 104 (or conductive bumps) within the engagement area. This aspect may allow the outer vias 114 of the circuit-bearing interconnect component 100 to be engaged with standardized test apparatus having multiple test probes (not shown), thereby permitting the bumped die 12 to be subjected to rapid, multi-functional testing using conventional, mass-production test equipment.

Figure 4:
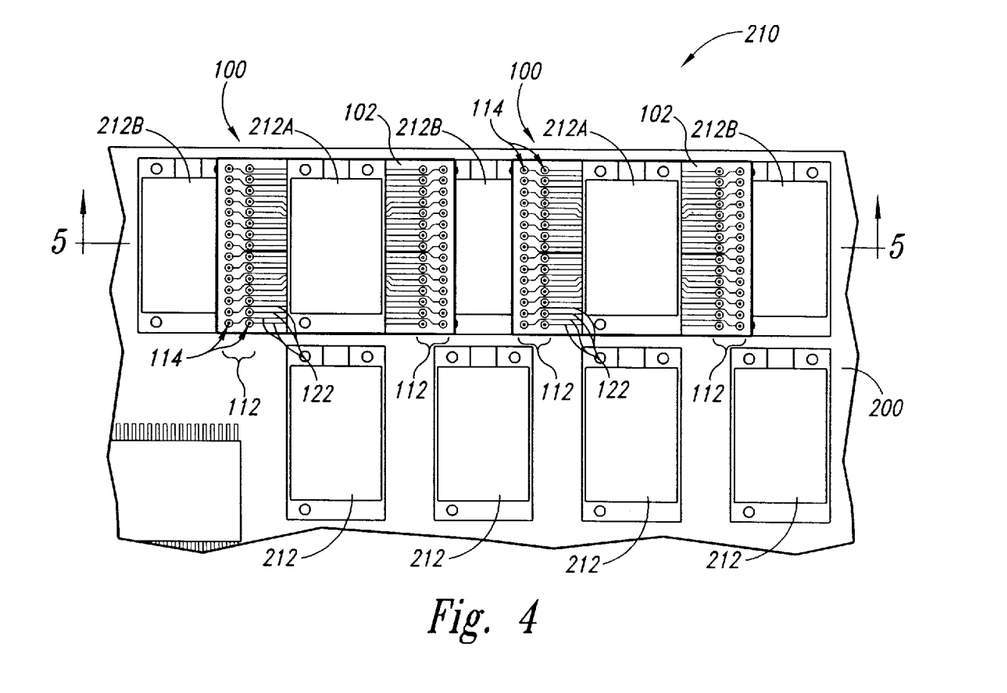
FIG. 4 is an upper plan view of a semiconductor assembly having a plurality of semiconductor components attached to a printed circuit board and including a plurality of circuit-bearing interconnect components in accordance with an alternate embodiment of the invention.
Figure 5:
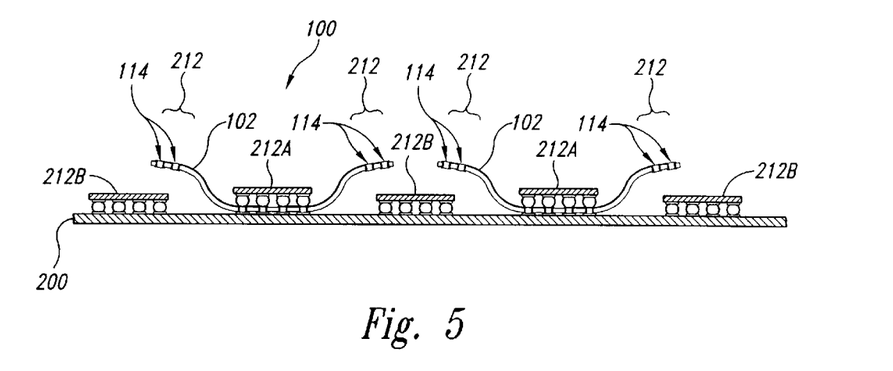
FIG. 5 is a side cross-sectional view of the semiconductor assembly of FIG. 4.

FIG. 4 is an upper plan view of a semiconductor assembly 210 having a plurality of semiconductor components 212 attached to a printed circuit board 220 and including a plurality of circuit-bearing interconnect components 100 in accordance with an alternate embodiment of the invention. FIG. 5 is a side cross-sectional view of the semiconductor assembly 210 of FIG. 4. In this embodiment, each semiconductor component 212 is attached to the printed circuit board 220 in the manner described above with reference to FIGS. 2 and 3. The circuit-bearing interconnect components 100 may include a rigid substrate 102, or may have a flexible substrate of the type shown in FIG. 3 As best shown in FIG. 5, however, the outer areas 112 of each circuit-bearing interconnect component 100 are not shaped or bent around the associated bumped die 212A, but rather, the substrate 102 extends upwardly and outwardly from the bumped die 212A so that the outer areas 112 and the outer vias 114 are positioned at least partially over a backside surface of an adjacent bumped die 212B.

As shown in FIG. 4, circuit-bearing interconnect components 100 advantageously allow testing of semiconductor components 212 even when the semiconductor components 212 are tightly spaced on the printed circuit board 220. The substrate 102 may be shaped so that the outer via 114 may be positioned above the backside surface 130 of an adjacent semiconductor component 212 (FIG. 4), providing easy access for one or more test probes 150 to be inserted into the outer via 114. Therefore, the above-described advantages provided by the circuit-bearing interconnect components 100 may be realized in the semiconductor assembly 210 having a plurality of tightly spaced semiconductor components 212.

Figure 6:
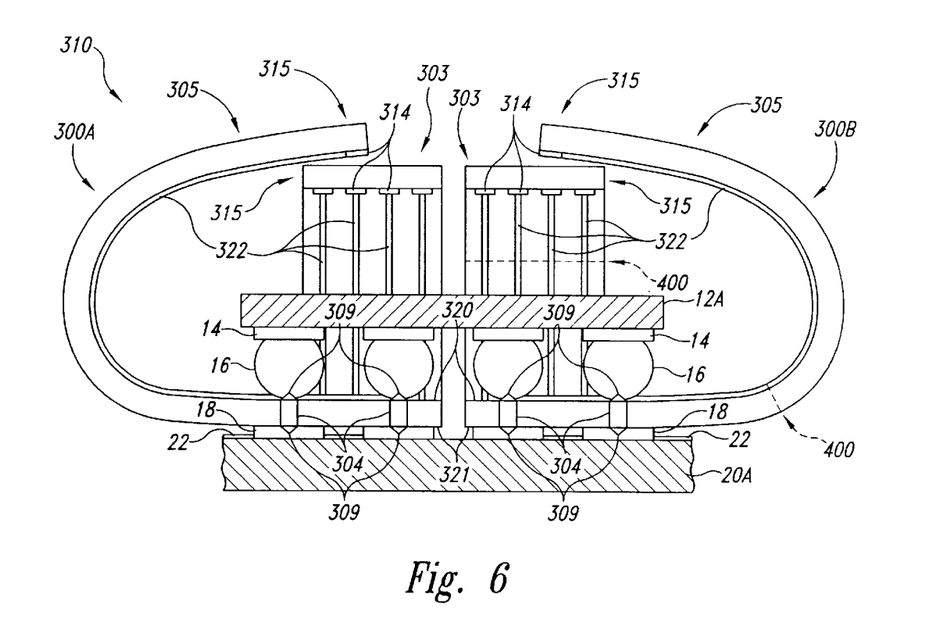
FIG. 6 is a side cross-sectional view of a semiconductor package having a bumped die engaged with a pair of circuit-bearing interconnect components in accordance with an alternate embodiment of the invention.
Figure 7:
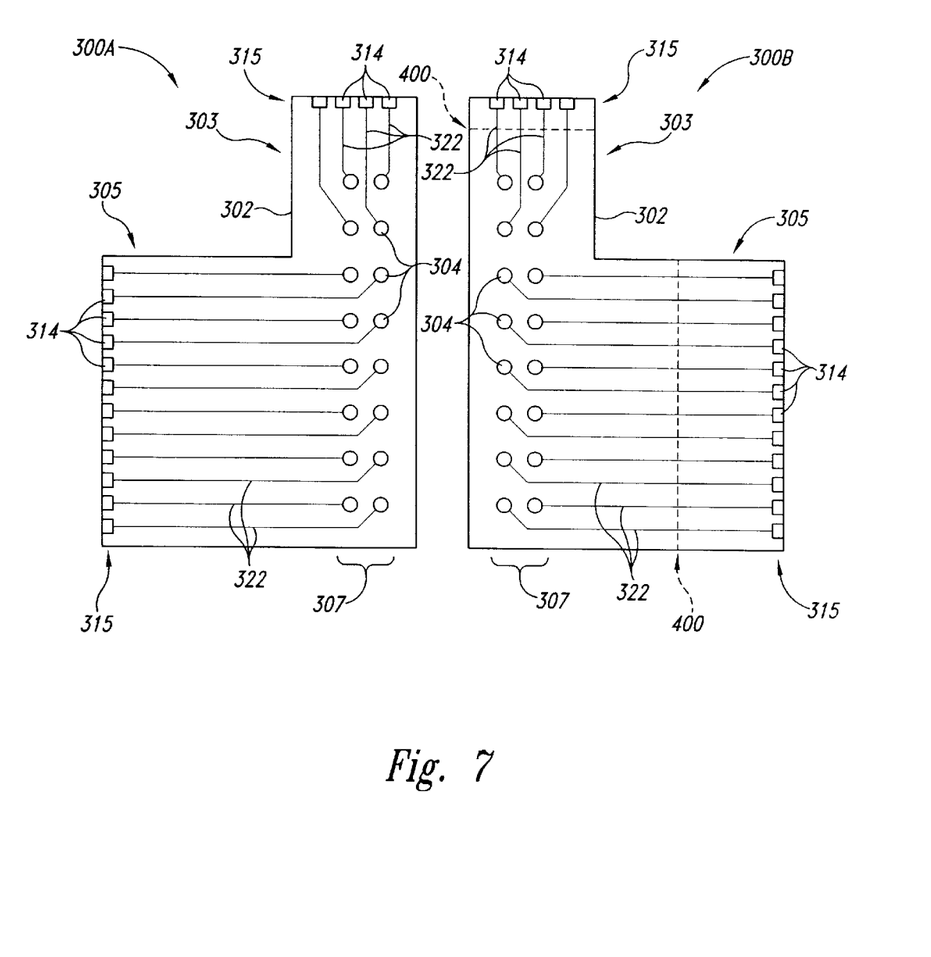
FIG. 7 is an upper plan view of embodiments of circuit-bearing interconnect components of FIG. 5 having flexible substrates.

FIG. 6 is a side cross-sectional view of a semiconductor package 310 having a bumped die 12A engaging a pair of circuit-bearing interconnect components 300A, 300B in accordance with an alternate embodiment of the invention. As shown in the upper plan view of FIG. 7, each of the circuit bearing interconnect components 300A, 300B may include a flexible substrate 302 shapeable into a flattened position and having an aft portion 303 and a lateral portion 305. The substrate 302 may be flexible, as shown in FIGS. 6 or 7, or rigid, as shown in FIG. 6. A plurality of conductive pins (or posts) 304 are disposed within an engagement area 307 in a pattern corresponding to the pattern of at least some of the conductive bumps 16 on the bumped die 12A. The conductive pins 304 extend through each substrate 302 from a first outer surface 320 to a second surface 321. A pointed tip 309 is disposed at each end of the conductive pins 304.

A plurality of conductive leads 322 are disposed on the first outer surface 320 of each substrate 302. Each conductive lead 322 is electrically coupled to a conductive pin 304 and extends outwardly from the engagement area 307. Some of the conductive leads 320 extend across the aft portion 303, while other conductive leads extend across the lateral portion 305. A plurality of test pads 314 are formed along outer (peripheral) edges 315 of the substrate 302. Each test pad 314 is coupled to one of the conductive leads 322.

During assembly, the conductive bumps 16 of the bumped die 12A may be aligned with the conductive pins 304 of each respective circuit-bearing interconnect component 300A, 300B. Also, the contact pads 18 of a printed circuit board 20A may be aligned with the conductive pins 304. Using a compressive force, the pointed tips 309 of the conductive pins 304 that protrude above the first and second surfaces 320, 321 may be driven into the surfaces of the conductive bumps 16 and the contact pads 18, respectively, thereby piercing a layer of oxide that may reside on the surfaces of these components and improving the electrical connection therebetween. Alternately, the pointed tips 309 may be eliminated, and the conductive bumps 16 and the contact pads 18 may be attached to the conductive pins 304 using other attachment techniques, such as by soldering, thermal bonding, or using conductive adhesive compounds. Following assembly, each conductive bump 16 of the bumped die 12A is electrically coupled with the corresponding contact pad 18 of the printed circuit board 20A by one of the conductive pins 304, and each conductive pin 304 is electrically coupled with its associated test pad 314 by one of the conductive leads 322.

The circuit-bearing interconnect components 300A, 300B having the plurality of test pads 314 distributed along lateral edges 315 of the substrate 302 further improves the ease, accuracy, and reliability of the testing process. Because the test pads 314 are distributed on the lateral edges 315, the lateral edges 315 may be inserted into a suitable socket or receptacle (not shown) for sending and receiving signals to and from the conductive bumps 16. Testing of the semiconductor package 310 may be done more rapidly than alternate methods involving applying a test probe to each test pad 314 (or outer via 114) individually. Furthermore, accuracy of the testing may be increased because the possibility of contacting the test probe with the wrong test pad 314 (or outer via 114) is reduced or eliminated. As described above, the circuit-bearing interconnect components 300A, 300B allow the bumped die 12A to be tested easily and efficiently after it has been assembled with the printed circuit board 20A.

Another advantage is that the circuit-bearing interconnect components 300A, 300B may be used to test bumped die 12A in a variety of tight spaces and packaging configurations. Because the aft portion 303 of the substrate 302 includes some of the test pads 314 while the lateral portion 305 includes the remainder of the test pads 314, the circuit-bearing interconnect components 300A, 300B provide a useful alternative to embodiments having all of the conductive leads extending away from only one side of the semiconductor component being tested. In other words, if the position of the semiconductor component within a particular package does not permit all of the test leads of the circuit-bearing component to extend from one side of the component to permit testing, alternate embodiments of circuit-bearing interconnect components having conductive leads extending from two or more sides of the component to be tested may be used.

In an alternate embodiment, the circuit-bearing interconnect component 300B includes a pair of frangible sections 400 (FIGS. 6 & 7). One of the frangible sections 400 is disposed within the aft portion 303 of the substrate 302, and the other frangible section 400 is disposed within the lateral portion 305 of the substrate 302. The frangible sections 400 are weakened, breakable sections across the aft and lateral portions 303, 305, including the conductive leads 322, that may be broken, torn apart, or otherwise parted without damaging the other components of the circuit-bearing interconnect component 300B, the bumped die 12A, or printed circuit board 20A.

It should be understood that the frangible sections 400 may be positioned at a variety of locations along the aft and lateral portions 303, 305. Also, it is not necessary that both the aft and lateral portions 303, 305 include a frangible section 400, but rather, may be included in only a single distal portion of the substrate. Of course, the frangible sections 400 may be included in either rigid or flexible substrates.

One advantage of the frangible sections 400 is that after installation and testing of the bumped die 12A using the circuit-bearing interconnect component 300B, the aft and lateral portions 303, 305 of the substrate 302 may be removed from the semiconductor package 310. This may advantageously allow the resulting package to take up less space than the semiconductor package 310 having the aft and lateral portions 303, 305 (FIGS. 2 & 6).

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other apparatus and methods of apparatus and methods of testing and assembling FBGA packages having circuit-bearing interconnect components, and not just to the embodiments described above and shown in the accompanying figures. Accordingly, the scope of the invention should be determined from the following claims.

What is claimed is:

1. A method of testing a semiconductor component having a plurality of conductive bumps, comprising:
    engaging a circuit-bearing interconnect component having a plurality of first conductive elements disposed therethrough with the plurality of conductive bumps, each first conductive element being electrically coupled with a first end of a conductive trace, the conductive trace having a second end extending away from the conductive bump to a distal portion substantially beyond an edge of the semiconductor component;
    transmitting a test signal through at least one second end to the corresponding conductive bump of the semiconductor component; and
    receiving a feedback signal from the semiconductor component indicative of a performance characteristic of the semiconductor component.

2. The method of claim 1, further comprising engaging a test probe with at least one of the second ends.

3. The method of claim 1 wherein engaging a circuit-bearing interconnect component having a plurality of first conductive elements disposed therethrough with the plurality of conductive bumps comprises attaching a plurality of conductive via with the plurality of conductive bumps.

4. The method of claim 1 wherein engaging a circuit-bearing interconnect component having a plurality of first conductive elements disposed therethrough with the plurality of conductive bumps comprises attaching a plurality of conductive pins with the plurality of conductive bumps.

5. The method of claim 1, further comprising bending at least the distal portion of the circuit-bearing interconnect component.

6. The method of claim 5 wherein bending at least the distal portion of the circuit-bearing interconnect component comprises bending the distal portion through an approximately 180 degree arc so that the second ends of the conductive traces are proximate a backside surface of the semiconductor component.

7. The method of claim 1 wherein receiving a feedback signal from the semiconductor component comprises receiving a feedback signal through at least one of the conductive traces.

8. The method of claim 1, further comprising engaging a semiconductor device having a plurality of contact pads with the circuit-bearing interconnect component, each contact pad being electrically coupled with one of the first conductive elements.

9. The method of claim 1 wherein the distal portion includes a frangible section, further comprising removing the distal portion of the circuit-bearing interconnect component.

10. A method of testing a semiconductor component having a plurality of conductive bumps, comprising:

engaging a circuit-bearing interconnect component having a plurality of first conductive elements disposed therethrough with the plurality of conductive bumps, each first conductive element having a first end electrically coupled with one of the conductive bumps and with a conductive trace, each conductive trace having a second end that extends away from the first conductive element to a distal portion substantially beyond an edge of the semiconductor component;

engaging a semiconductor device having a plurality of contact pads with the circuit-bearing interconnect component, each contact pad being electrically coupled with one of the first conductive elements;

transmitting a test signal from the semiconductor device through at least one first conductive element to the corresponding conductive bump of the semiconductor component; and receiving a feedback signal from the semiconductor component indicative of a performance characteristic of the semiconductor component.

11. The method of claim 10, further comprising engaging a test probe with at least one of the second ends.

12. The method of claim 10 wherein engaging a circuit-bearing interconnect component having a plurality of first conductive elements disposed therethrough with the plurality of conductive bumps comprises attaching a plurality of conductive via with the plurality of conductive bumps.

13. The method of claim 10 wherein engaging a circuit-bearing interconnect component having a plurality of first conductive elements disposed therethrough with the plurality of conductive bumps comprises attaching a plurality of conductive pins with the plurality of conductive bumps.

14. The method of claim 10, further comprising bending at least the distal portion of the circuit-bearing interconnect component.

15. The method of claim 14 wherein bending at least the distal portion of the circuit-bearing interconnect component comprises bending the distal portion through an approximately 180 degree arc so that the second ends of the conductive traces are proximate a backside surface of the semiconductor component.

16. The method of claim 10 wherein the distal portion includes a frangible section, further comprising removing the distal portion of the circuit-bearing interconnect component.

\* \* \* \* \*

UNITED STATES PATENT AND TRADEMARK OFFICE
CERTIFICATE OF CORRECTION

PATENT NO. : 6,562,641 B1
DATED : May 13, 2003
INVENTOR(S) : Stacy L. Freeman

It is certified that error appears in the above-identified patent and that said Letters Patent is hereby corrected as shown below:

Title page,
Item [*] Notice, "Subject to any disclaimer, the term of this patent extended or adjusted under 35 U.S.C. 154(b) by 0 days." should read -- Subject to any disclaimer, the term of this patent is extended or adjusted under 35 U.S.C. 154(b) by 10 days. --
Item [56], References Cited, U.S. PATENT DOCUMENTS, insert
-- 6,452,807 B1   9/2002   Barrett..........361/767 --

Column 1,
Line 17, "testing it semiconductor" should read -- testing semiconductor --
Line 30, "attached to associated" should read -- attached to an associated --

Column 3,
Line 9, "second end An extending""" should read -- second end extending --

Column 8,
Lines 15-16, "to other apparatus and methods of apparatus and methods of testing" should read -- to other apparatus and methods of testing --

Signed and Sealed this

Third Day of August, 2004

JON W. DUDAS
*Acting Director of the United States Patent and Trademark Office*